(12) United States Patent
Sato et al.

(10) Patent No.: US 12,300,525 B2
(45) Date of Patent: May 13, 2025

(54) CONTROLLING METHOD AND SUBSTRATE TRANSPORT MODULE

(71) Applicant: Tokyo Electron Limited, Tokyo (JP)

(72) Inventors: Hiroto Sato, Oshu (JP); Takahiro Miki, Nirasaki (JP); Mitsuru Obara, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 671 days.

(21) Appl. No.: 17/581,248

(22) Filed: Jan. 21, 2022

(65) Prior Publication Data

US 2022/0238359 A1 Jul. 28, 2022

(30) Foreign Application Priority Data

Jan. 26, 2021 (JP) ................................ 2021-010067

(51) Int. Cl.
*H01L 21/67* (2006.01)
*G05D 7/06* (2006.01)

(52) U.S. Cl.
CPC ..... *H01L 21/67253* (2013.01); *G05D 7/0688* (2013.01); *H01L 21/67017* (2013.01)

(58) Field of Classification Search
None
See application file for complete search history.

(56) References Cited

U.S. PATENT DOCUMENTS

2008/0247846 A1* 10/2008 Mochizuki ........ H01L 21/67248
414/221

FOREIGN PATENT DOCUMENTS

| JP | S61213539 A | 9/1986 |
| JP | 2018-160543 A | 10/2018 |
| JP | 2018-160544 A | 10/2018 |
| KR | 1020200063977 A | 6/2020 |

* cited by examiner

*Primary Examiner* — Sean Shechtman
(74) *Attorney, Agent, or Firm* — Nath, Goldberg & Meyer; Tanya E. Harkins

(57) ABSTRACT

A controlling method according to an aspect of the present disclosure includes a first chamber provided with a fan, a second chamber to which a replacement gas is sent from the first chamber by the fan and which includes a transporter configured to transport a substrate, a circulation line configured to communicate the first chamber and the second chamber with each other and circulate the replacement gas, and a valve provided in the circulation line. The method includes replacing an inside of the first chamber and an inside of the second chamber with the replacement gas by turning off the fan and closing the valve, and circulating the replacement gas through the circulation line by turning on the fan and opening the valve. The replacing includes controlling the fan to be turned on and the valve to be opened for a predetermined period of time.

17 Claims, 8 Drawing Sheets

CONTROLLING METHOD AND SUBSTRATE TRANSPORT MODULE

CROSS-REFERENCE TO RELATED APPLICATION

This application is based upon and claims the benefit of priority from Japanese Patent Application No. 2021-010067, filed on Jan. 26, 2021, the entire contents of which are incorporated herein by reference.

TECHNICAL FIELD

The present disclosure relates to a controlling method and a substrate transport module.

BACKGROUND

In an EFEM including a first chamber provided with an inlet into which a replacement gas is introduced and a second chamber provided with a transport robot, a technique for forming a predetermined pressure difference between the first chamber and the second chamber such that the pressure of the first chamber is higher than the pressure of the second chamber is known (see, for example, Patent Document 1).

PRIOR ART DOCUMENT

Patent Document

Patent Document 1: Japanese Laid-Open Patent Publication No. 2018-160543

SUMMARY

A controlling method in accordance with an aspect of the present disclosure is a method of controlling a substrate transport module that includes a first chamber provided with a fan, a second chamber to which a replacement gas is sent from the first chamber by the fan and which includes a transporter configured to transport a substrate, a circulation line configured to communicate the first chamber and the second chamber with each other and circulate the replacement gas, and a valve provided in the circulation line. The method includes replacing an inside of the first chamber and an inside of the second chamber with the replacement gas by turning off the fan and closing the valve, and circulating the replacement gas through the circulation line by turning on the fan and opening the valve. The replacing includes controlling the fan to be turned on and the valve to be opened for a predetermined period of time.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
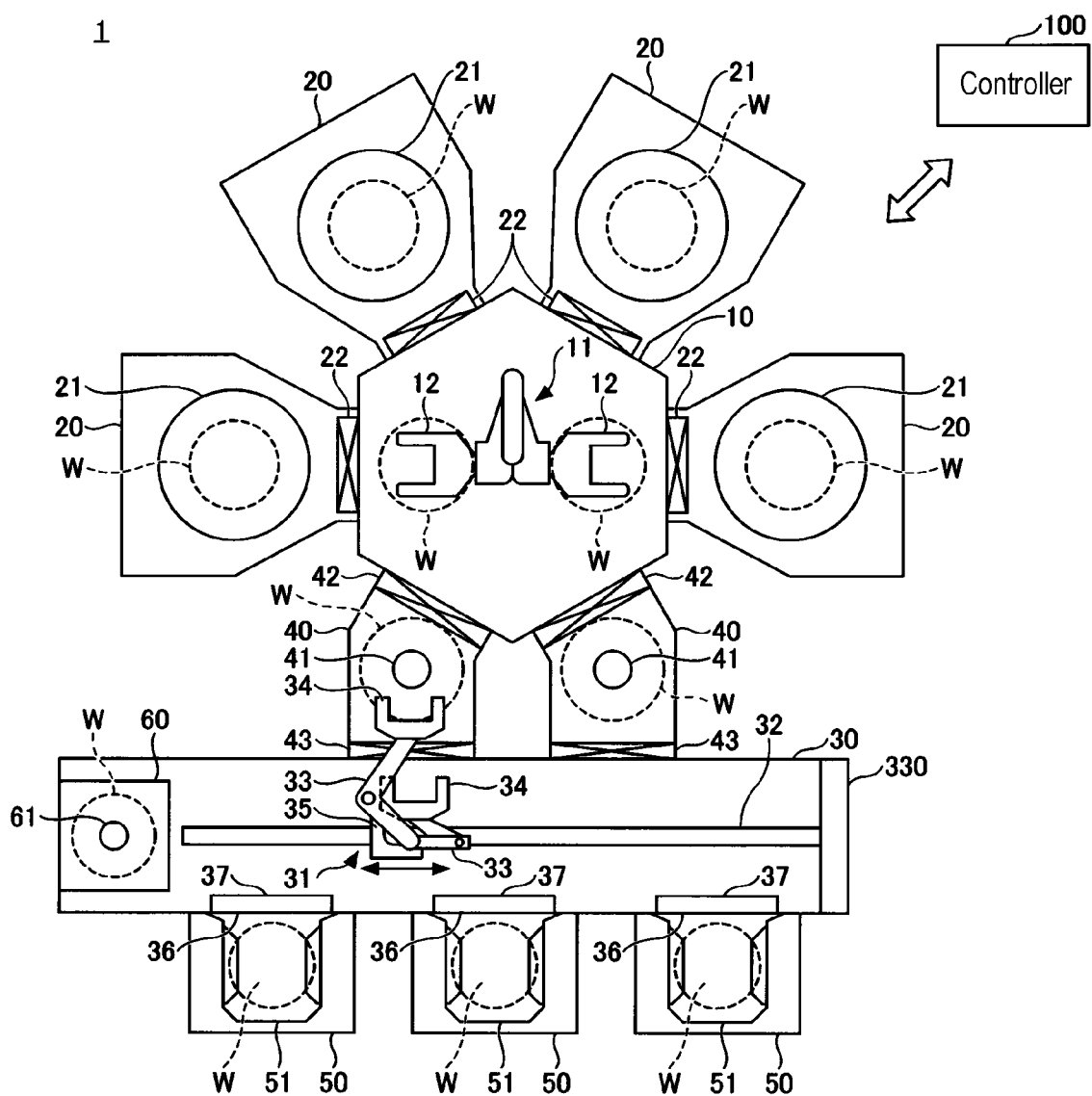
FIG. 1 is a view illustrating an example of a processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant explanations will be omitted.

[Processing System]

Figure 2:
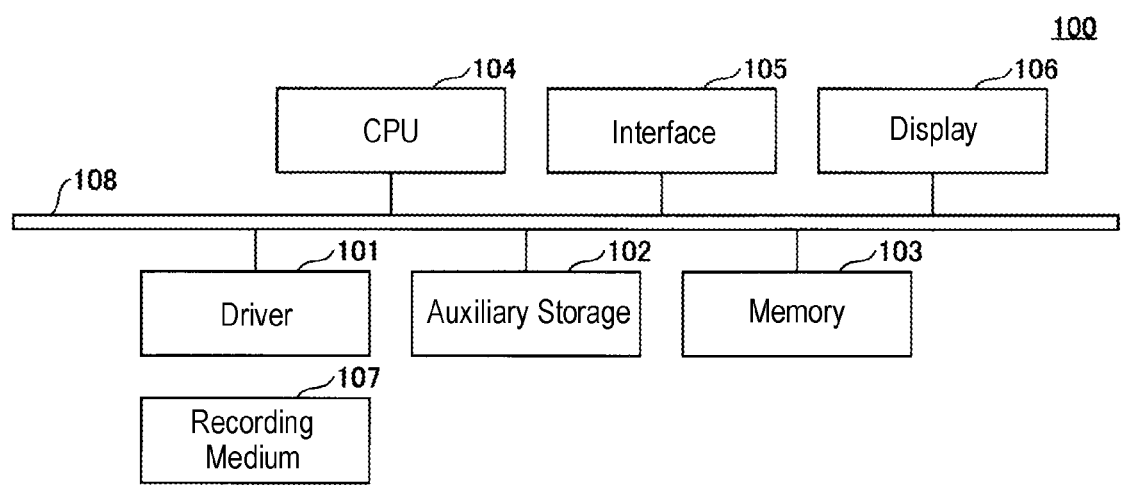
FIG. 2 is a view illustrating an example of a hardware configuration of a controller.

An example of a processing system of an embodiment will be described with reference to FIGS. 1 and 2. FIG. 1 is a view illustrating an example of a processing system according to an embodiment. FIG. 2 is a view illustrating an example of a hardware configuration of a controller.

A processing system 1 includes a transfer module 10, four process modules 20, a loader module 30, two load-lock modules 40, and a controller 100.

The transfer module 10 has a substantially hexagonal shape in a plan view. The transfer module 10 is configured with a vacuum chamber and includes a transporter 11 arranged therein. The transporter 11 is formed by an articulated arm configured to be bent or stretched, raised or lowered, and swiveled at a position where the process modules 20 and the load-lock module 40 can be accessed. The transporter 11 includes two picks 12 that can be independently bent or stretched in opposite directions to transport two wafers W at a time. A wafer W is an example of a substrate. The transporter 11 is not limited to the configuration illustrated in FIG. 1 as long as wafers W can be transported between the process modules 20 and the load-lock module 40.

The process modules 20 are arranged radially around the transfer module 10 and are connected to the transfer module 10. Each process module 20 is configured with a processing chamber and includes therein a columnar stage 21 on which a wafer W is placed. In the process module 20, a predetermined process such as a film forming process is performed on the wafer W placed on the stage 21. The transfer module 10 and the process modules 20 are partitioned by gate valves 22 that can be opened or closed.

The loader module 30 is an example of a substrate transport module, and is arranged to face the transfer module 10. The loader module 30 has a rectangular parallelepiped shape and is a transport chamber in which oxygen concentration and humidity are controlled. A transporter 31 is arranged in the loader module 30. The transporter 31 is slidably supported on a guide rail 32 that is provided in a central portion to extend within the loader module 30 along the longitudinal direction. A linear motor (not illustrated) including, for example, an encoder is built in the guide rail 32, and thus the transporter 31 moves along the guide rail 32 by driving the linear motor.

The transporter 31 includes two articulated arms 33 arranged vertically in two levels as transport arms. A bifurcated pick 34 is installed at the tip end of each articulated arm 33. A wafer W is held on each pick 34. Each articulated arm 33 is configured to be bent or stretched and raised or lowered in the radial direction from the center. In addition, the bending and stretching motions of each articulated arm 33 can be individually controlled. Respective rotation shafts of the articulated arms 33 are coaxially and rotatably connected to a base 35 so that the rotation shafts can be rotated integrally, for example, in a swivel direction relative to the base 35. The guide rail 32 and the articulated arms 33 function as drive mechanisms for moving the picks 34. The transporter 31 transports wafers W among load-lock modules 40, transport containers 51, and an aligner 60, which will be described later. The transporter 31 is not limited to the configuration illustrated in FIG. 1 as long as wafers W can be transported among the load-lock modules 40, the transport containers 51, and the aligner 60.

The aligner 60 is arranged in the loader module 30. The aligner 60 performs alignment of a wafer W. The aligner 60 includes a rotation stage 61 configured to be rotated by a drive motor (not illustrated), and thus rotates in a state in which a wafer W is placed on the rotation stage 61. An optical sensor (not illustrated) for detecting the peripheral edge of a wafer W is provided at outer periphery of the rotary stage 61. The aligner 60 detects the center position of the wafer W and the direction of a notch with respect to the center of the wafer W by the optical sensor and adjusts the position for transporting the wafer W such that the center position of the wafer W and the direction of the notch in the load-lock module 40 are at a predetermined position and direction.

Two load-lock modules 40 are connected to one side surface of the loader module 30 in the longitudinal direction. Meanwhile, on the other side surface of the loader module 30 in the longitudinal direction, one or more carry-in ports 36 for introducing wafers W are provided. In the illustrated example, three carry-in ports 36 are provided. Each carry-in port 36 is provided with an opening or closing door 37 configured to be opened or closed. In addition, a load port 50 is provided to correspond to each carry-in port 36. A transport container 51 for accommodating and transporting wafers W is placed on the load port 50. The transport container 51 may be a front-opening unified pod (FOUP) in which a plurality of (e.g., 25) wafers W are placed and accommodated in multiple levels at predetermined intervals.

A circulation part 330, which will be described later, is provided on one side surface of the loader module 30 in the transverse direction.

Each load-lock module 40 is arranged between the transfer module 10 and the loader module 30. The load-lock module 40 includes an internal pressure-variable chamber, the inside of which can be switched between vacuum and atmospheric pressure. Within each load-lock module 40, a columnar stage 41 on which a wafer W is placed is provided. When the wafer W is carried from the loader module 30 into the transfer module 10, the inside of the load-lock module 40 is maintained at atmospheric pressure to receive the wafer W from the loader module 30, and is then decompressed to carry the wafer W into the transfer module 10. When the wafer W is carried out from the transfer module 10 into the loader module 30, the inside is maintained at vacuum to receive the wafer W from the transfer module 10, and then the inside is boosted to atmospheric pressure to carry the wafer W into the loader module 30. The load-lock module 40 and the transfer module 10 are partitioned by a gate valve 42 that can be opened or closed. The load-lock module 40 and the loader module 30 are partitioned by a gate valve 43 that can be opened or closed.

The controller 100 controls an operation of each component of the processing system 1. As illustrated in FIG. 2, the controller 100 is a computer including a driver 101, an auxiliary storage 102, a memory 103, a CPU 104, an interface 105, a display 106, and the like, which are each connected to a bus 108 so as to be mutually connected. A program that implements a process in the controller 100 is provided by a recording medium 107 such as a CD-ROM. When the recording medium 107 storing the program is set in the driver 101, the program is installed in the auxiliary storage 102 from the recording medium 107 via the driver 101. However, the program does not necessarily have to be installed from the recording medium 107, and may be downloaded from another computer via a network. The auxiliary storage 102 stores necessary information such as an installed program and a recipe. When there is a command to start the program, the memory 103 reads the program from the auxiliary storage 102 and stores the program. The CPU 104 executes a function related to the processing system 1 according to the program stored in the memory 103. The interface 105 is used as an interface for connecting to a network. The display 106 displays various pieces of information and also functions as an operation device that accepts operations by an operator.

[Loader Module]

Figure 3:
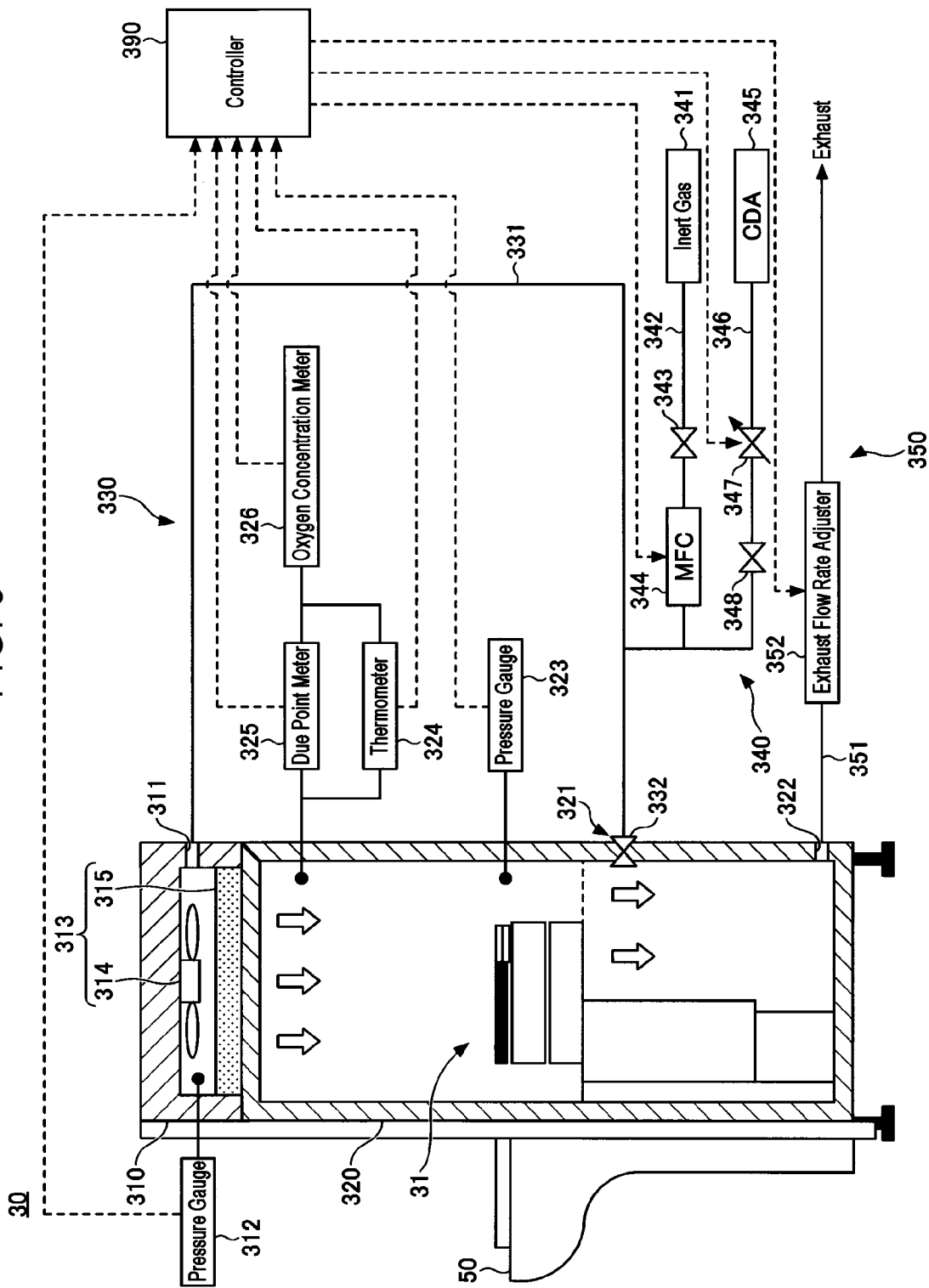
FIG. 3 is a view illustrating an example of a loader module.

An example of a loader module 30 of an embodiment will be described with reference to FIG. 3. FIG. 3 is a view illustrating an example of the loader module 30.

The loader module 30 is, for example, an equipment front end module (EFEM) and forms a space having a higher degree of cleanliness than the environment in the factory in which the processing system 1 is provided. The space may be, for example, a mini-environment (Mini-E). The loader module 30 includes a first chamber 310, a second chamber 320, a circulation part 330, a gas introduction part 340, an exhaust part 350, and a controller 390.

The first chamber 310 is connected to an upper portion of the second chamber 320. The pressure within the first chamber 310 is set to be lower than the pressure within the second chamber 320. The first chamber 310 includes an inlet port 311, a first pressure gauge 312, and an airflow generator 313.

The inlet port 311 is a port through which a replacement gas is introduced from the circulation part 330, and the replacement gas is introduced into the first chamber 310 from the circulation part 330 through the inlet port 311. In the present embodiment, the inlet port 311 is formed in one side wall of the first chamber 310, but the inlet port 311, for example, may be formed in each of two opposite side walls of the first chamber 310 or may be formed in the ceiling of the first chamber 310. The replacement gas may be, for example, an inert gas, such as nitrogen ($N_2$) or argon (Ar), or clean dry air (CDA).

The first pressure gauge 312 measures the pressure within the first chamber 310 and transmits the measured value to the controller 390.

The airflow generator 313 includes a circulation fan 314 and a filter 315. The circulation fan 314 is provided within the first chamber 310, and the replacement gas is sent from the inside of the first chamber 310 into the inside of the second chamber 320. The filter 315 is provided below the circulation fan 314, purifies the replacement gas sent by the circulation fan 314 by filtering the replacement gas, and supplies the purified replacement gas into the second chamber 320. The filter 315 includes, for example, an ultra-low penetration air (ULPA) filter and a chemical filter. By driving the circulation fan 314, the airflow generator 313 generates a downward flow of the purified gas from the first chamber 310 to the second chamber 320. The airflow generator 313 may be a fan filter unit (FFU) in which the circulation fan 314 and the filter 315 are integrated.

The second chamber 320 is connected to the bottom side of the first chamber 310, and the above-mentioned transporter 31 is disposed inside the second chamber 320. The second chamber 320 includes a circulation port 321, an exhaust port 322, a second pressure gauge 323, a thermometer 324, a dew point meter 325, and an oxygen concentration meter 326.

The circulation port 321 is a port for causing the replacement gas to flow out from the inside of the second chamber 320 to the circulation line 331, and the replacement gas flows out from the inside of the second chamber 320 to the circulation part 330 through the circulation port 321. In the present embodiment, the circulation port 321 is formed in one side wall of the second chamber 320, but the circulation port 321, for example, may be formed in each of two opposite side walls of the second chamber 320, and may be formed in the bottom portion.

The exhaust port 322 is a port for exhausting a gas from the inside of the second chamber 320 to the exterior, and the gas is exhausted from the inside of the second chamber 320 through the exhaust port 322. In the present embodiment, the exhaust port 322 is formed in one side wall of the second chamber 320, but the exhaust port 322, for example, may be formed in each of two opposite side walls of the second chamber 320, or may be formed in the bottom portion. In addition, the exhaust port 322, for example, may be formed in the circulation line 331.

The second pressure gauge 323, the thermometer 324, the dew point meter 325, and the oxygen concentration meter 326 measure the pressure, temperature, dew point temperature, and oxygen concentration in the second chamber 320, respectively, and transmit the measured values to the controller 390.

The circulation part 330 circulates the replacement gas from the inside of the second chamber 320 to the inside of the first chamber 310. The circulation part 330 includes a circulation line 331 and a circulation valve 332.

One end of the circulation line 331 is connected to the inlet port 311 and the other end is connected to the circulation port 321 to allow an inside of the first chamber 310 and an inside of the second chamber 320 to communicate with each other such that the replacement gas is circulated from the inside of the second chamber 320 to the inside of the first chamber 310.

The circulation valve 332 is provided to enable opening or closing of the circulation port 321 to control the communication state between the inside of the second chamber 320 and the inside of the circulation line 331. When the circulation valve 332 is closed, the communication between the second chamber 320 and the circulation line 331 is cut off, and the circulation of the replacement gas from the second chamber 320 to the first chamber 310 is stopped. On the other hand, when the circulation valve 332 is opened, the inside of the second chamber 320 and the inside of the circulation line 331 communicate with each other, and the replacement gas circulates from the inside of the second chamber 320 to the inside of the first chamber 310. In addition, the circulation valve 332 may be provided in the circulation line 331.

The gas introduction part 340 introduces an inert gas and clean dry air, which are replacement gases, into the circulation line 331. The gas introduction part 340 includes an inert gas source 341, an inert gas supply pipe 342, a valve 343, a flow rate controller 344, a CDA source 345, a CDA supply pipe 346, a flow rate adjusting valve 347, and a valve 348.

The inert gas source 341 supplies the inert gas into the circulation line 331 via the inert gas supply pipe 342. The inert gas may be, for example, $N_2$ or Ar. The valve 343 is provided in the inert gas supply pipe 342 to open or close the flow path in the inert gas supply pipe 342. The flow rate controller 344 is provided in the inert gas supply pipe 342 to control the flow rate of the inert gas flowing in the inert gas supply pipe 342. The flow rate controller 344 may be, for example, a mass flow controller (MFC).

The CDA source 345 supplies clean dry air (CDA) into the circulation line 331 via the CDA supply pipe 346. The flow rate adjusting valve 347 is provided in the CDA supply pipe 346 to adjust the flow rate of the clean dry air flowing in the CDA supply pipe 346. The valve 348 is provided in the CDA supply pipe 346 to open or close the flow path in the CDA supply pipe 346.

The gas introduction part 340 supplies at least one of the inert gas, the flow rate of which is controlled by the flow rate controller 344, and the clean dry air, the flow rate of which is controlled by the flow rate adjusting valve 347, into the circulation line 331.

The exhaust part 350 exhausts the gas in the second chamber 320. The exhaust part 350 includes an exhaust pipe 351 and an exhaust flow rate adjuster 352. The exhaust pipe 351 is connected to the exhaust port 322 of the second chamber 320. The exhaust flow rate adjuster 352 is provided in the exhaust pipe 351 to adjust the exhaust flow rate of the gas from the inside of the second chamber 320. For example, the exhaust flow rate adjuster 352 includes two or more exhaust flow paths having different exhaust conductance, and is configured to adjust the exhaust flow rate by switching an exhaust flow path communicating with the exhaust pipe 351. Further, the exhaust flow rate adjuster 352, for example, may include an opening degree control valve and may be configured to adjust the exhaust flow rate by controlling the opening degree of the opening degree control valve. The exhaust part 350 evacuates the inside of the second chamber 320 through the exhaust pipe 351 by the exhaust flow rate adjuster 352 such that the inside of the second chamber 320 has a predetermined pressure.

The controller 390 controls at least one of the airflow generator 313, the gas introduction part 340, and the exhaust part 350 based on at least one measured value of the first pressure gauge 312, the second pressure gauge 323, the thermometer 324, the dew point meter 325, and the oxygen concentration meter 326.

For example, when a wafer W is transported by the transporter 31, the controller 390 operates the circulation fan 314 and opens the circulation valve 332 to circulate the replacement gas between the inside of the first chamber 310 and the inside of the second chamber 320 through the circulation line 331. The controller 390 adjusts at least one of the gas introduction part 340 and the exhaust part 350 such that the inside of the first chamber 310 is in a positive pressure state. For example, the controller 390 adjusts the inside of the first chamber 310 to a positive pressure state by controlling the exhaust flow rate adjuster 352 of the exhaust part 350 to reduce the exhaust flow rate of evacuating the inside of the second chamber 320. In addition, the controller 390, for example, adjusts the inside of the first chamber 310 to a positive pressure state by opening the valve 348 of the gas introduction part 340 and increasing the opening degree of the flow rate adjusting valve 347 to increase the amount of clean dry air supplied into the first chamber 310 via the circulation line 331. Further, the controller 390, for example, adjusts the inside of the first chamber 310 to a positive pressure state by opening the valve 343 of the gas introduction part 340 by adjusting the flow rate controller 344 to increase the amount of the inert gas supplied to the inside of the first chamber 310 via the circulation line 331. The controller 390 may perform these operations in combination.

Figure 4:
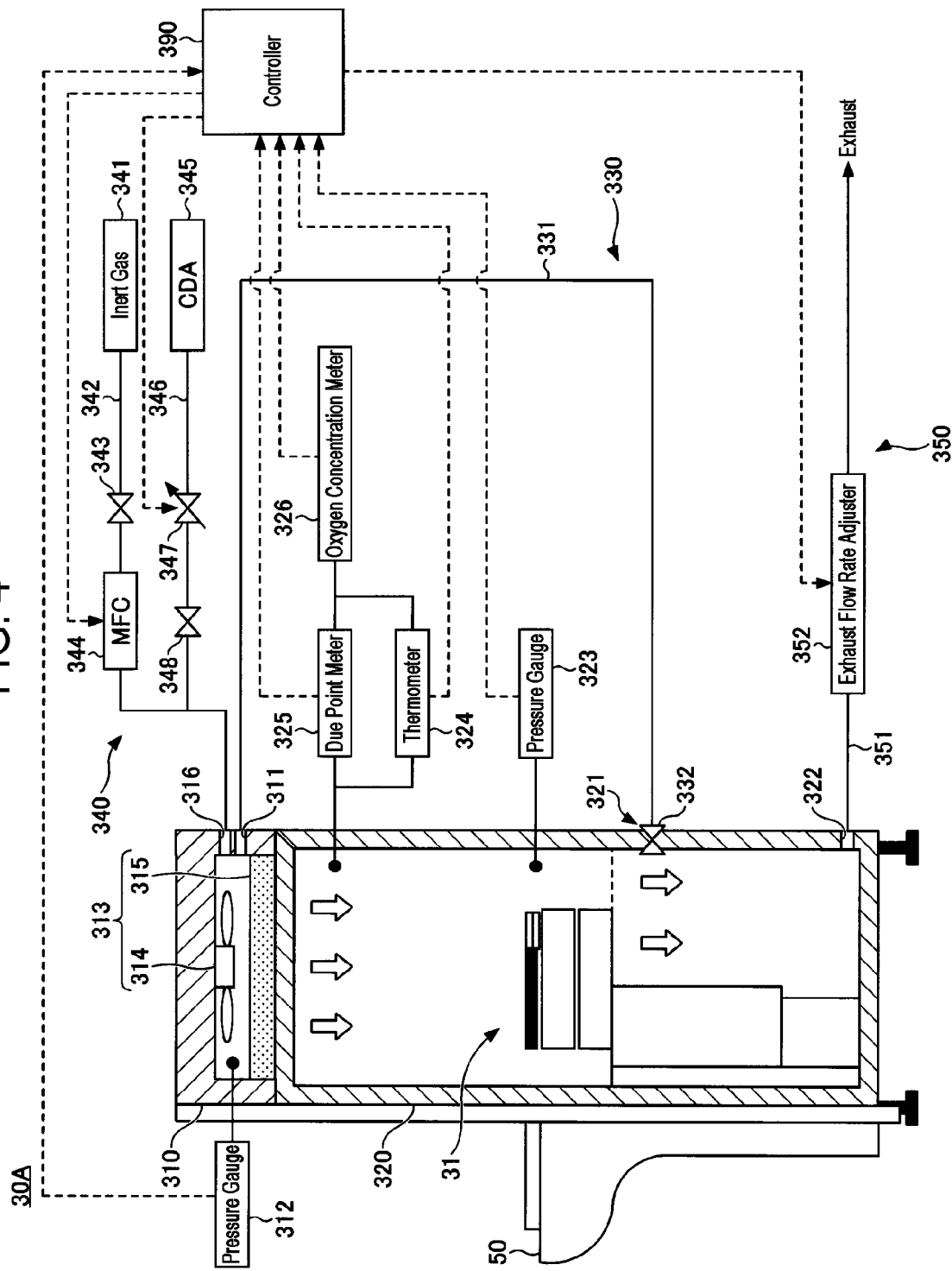
FIG. 4 is a view illustrating another example of the loader module.

Another example of the loader module 30 of the embodiment will be described with reference to FIG. 4. The loader module 30A illustrated in FIG. 4 is different from the loader module 30 illustrated in FIG. 3 in that the gas introduction part 340 introduces the inert gas and the clean dry air as replacement gases into the first chamber 310. The other configurations may be the same as those of the loader module 30 illustrated in FIG. 3. Hereinafter, a configuration different from that of the loader module 30 illustrated in FIG. 3 will be mainly described.

The first chamber 310 includes a second inlet port 316 in addition to the configuration illustrated in FIG. 3. The second inlet port 316 is a port through which the replacement gas is introduced from the gas introduction part 340, and the replacement gas is introduced from the gas introduction part 340 into the first chamber 310 via the second inlet port 316. In the present embodiment, among the side walls of the first chamber 310, the second inlet port 316 is formed in the same side wall as the side wall in which the inlet port 311 is formed, but the second inlet port 316, for example, may be formed in a side wall different from the side wall in which the inlet port 311 is formed. For example, the second inlet port 316 may be formed in the ceiling. In addition, the second inlet ports 316, for example, may be formed in multiple portions of the side walls and the ceiling of the first chamber 310.

The gas introduction part 340 introduces the inert gas and clean dry air, which are replacement gases, into the first chamber 310. The gas introduction part 340 includes an inert gas source 341, an inert gas supply pipe 342, a valve 343, a flow rate controller 344, a CDA source 345, a CDA supply pipe 346, a flow rate adjusting valve 347, and a valve 348. The gas introduction part 340 supplies at least one of the inert gas, the flow rate of which is controlled by the flow rate controller 344, and the clean dry air, the flow rate of which is controlled by the flow rate adjusting valve 347, into the first chamber 310.

[Controlling Method]

Figure 5:
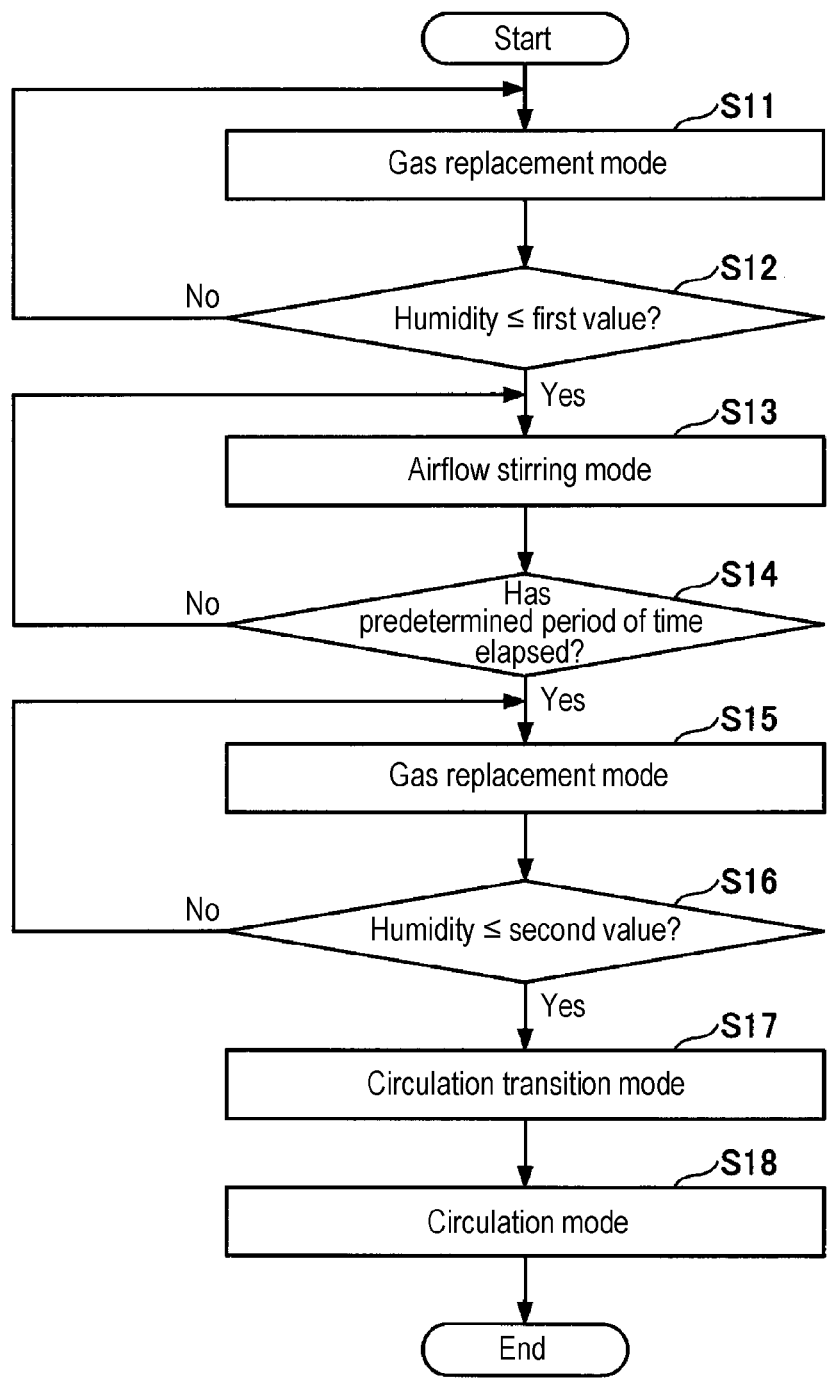
FIG. 5 is a diagram illustrating an example of a controlling method of an embodiment.
Figure 6:
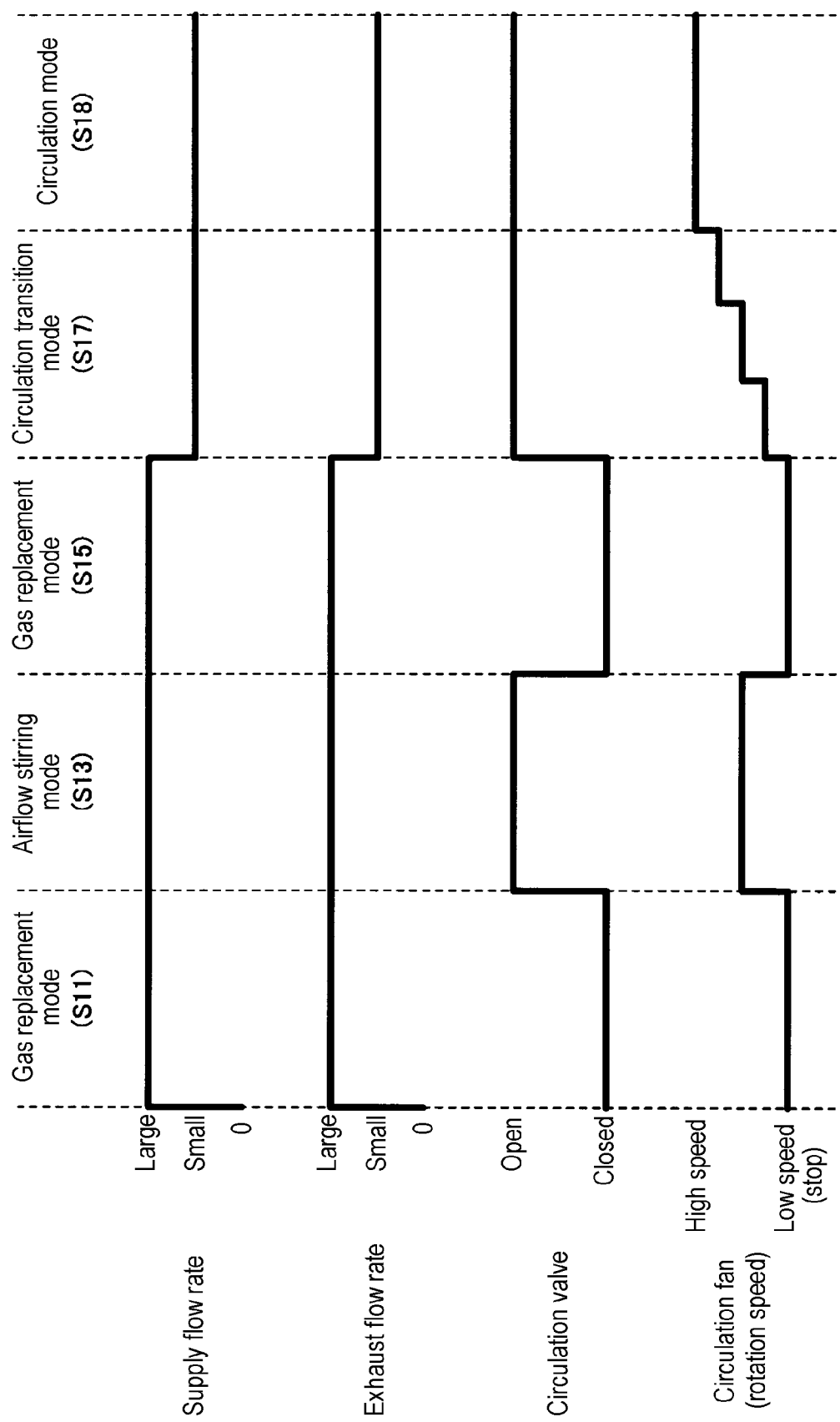
FIG. 6 is a view illustrating an example of operations of a valve and a circulation fan in the controlling method of FIG. 5.
Figure 7:
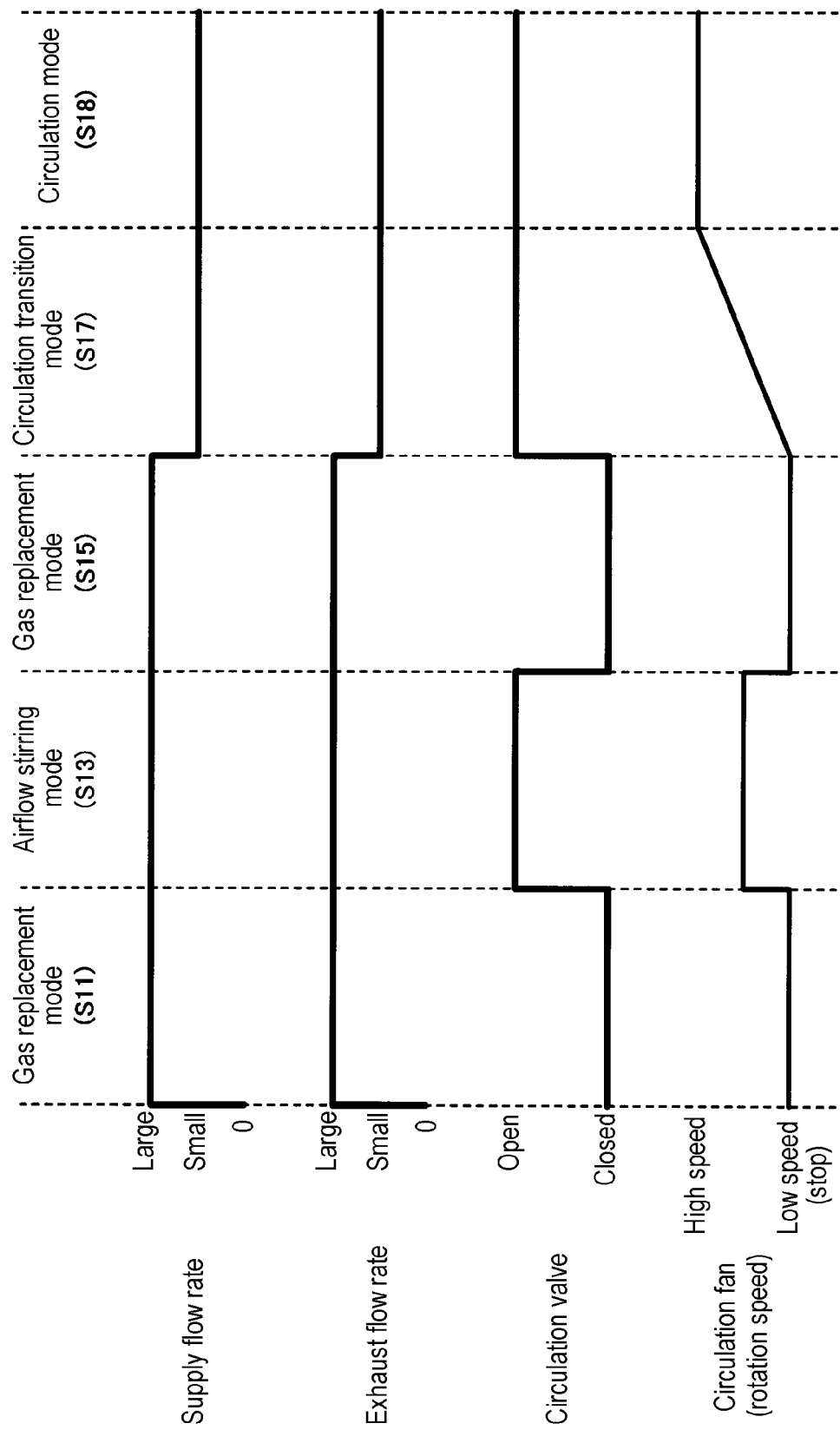
FIG. 7 is a view illustrating another example of operations of the valve and the circulation fan in the controlling method of FIG. 5.

An example of a controlling method of an embodiment will be described with reference to FIGS. 5 to 7. FIG. 5 is a diagram illustrating an example of a controlling method of an embodiment. FIG. 6 is a view illustrating an example of operations of a valve and a circulation fan in the controlling method of FIG. 5. FIG. 7 is a view illustrating another example of operations of the valve and the circulation fan in the controlling method of FIG. 5.

The controlling method illustrated in FIG. 5 is implemented, for example, when the loader module 30 is started or when the loader module 30 is returned after maintenance. In addition, the loader module 30 will be described assuming that at the start of the controlling method illustrated in FIG. 5, the inside of the second chamber 320 has an air atmosphere.

First, in step S11, the controller 390 operates the loader module 30 in a gas replacement mode. In the present embodiment, the controller 390 closes the circulation valve 332 and stops (turns off) the circulation fan 314. In addition, the controller 390 opens the valve 343, sets the flow rate of the flow rate controller 344 for setting to a maximum value (e.g., 1000 L/min), and controls the exhaust flow rate adjuster 352 to increase the exhaust flow rate. As a result, a large flow rate of an inert gas is introduced from the inert gas source 341 into the second chamber 320, and the air in the second chamber 320 is pushed out by the large flow rate of the inert gas, so that the air is exhausted from the inside of the second chamber 320 at a high speed. As a result, the air atmosphere inside the second chamber 320 is replaced with the inert gas atmosphere in a short period of time.

Next, in step S12, the controller 390 determines whether or not humidity in the second chamber 320 is equal to or lower than a first value. In the present embodiment, the controller 390 calculates the humidity in the second chamber 320 based on the measured value of the thermometer 324 and the measured value of the dew point meter 325, and determines whether or not the calculated humidity is equal to or lower than the first value. The first value is, for example, a value predetermined depending on a volume of the second chamber 320 or the like, and may be, for example, 50 ppm to 500 ppm. When it is determined in step S12 that the humidity in the second chamber 320 is equal to or lower than the first value, the controller 390 advances the process to step S13. When it is determined in step S12 that the humidity in the second chamber 320 is higher than the first value, the controller 390 returns the process to step S11. That is, the controller 390 operates the loader module 30 in the gas replacement mode until the humidity in the second chamber 320 becomes equal to or lower than the first value.

Next, in step S13, the controller 390 operates the loader module 30 in an airflow stirring mode. In the present embodiment, the controller 390 drives (turns on) the circulation fan 314 and opens the circulation valve 332 in a state in which the introduction of the inert gas into the second chamber 320 from the inert gas source 341 and evacuation of the inside of the second chamber 320 are continued. As a result, the airflow in the second chamber 320 is stirred, and the air (humidity), which remains in the corner inside the second chamber 320 and is difficult to be replaced in the gas replacement mode, is exhausted to the exterior of the second chamber 320. In step S13, the controller 390 drives, for example, the circulation fan 314 at a low speed.

Next, in step S14, the controller 390 determines whether or not a predetermined period of time has elapsed since the loader module 30 was operated in the airflow stirring mode. The predetermined period of time is, for example, a length of time predetermined depending on the volume of the second chamber 320 or the like. When it is determined in step S14 that a predetermined period of time has elapsed since the loader module 30 was operated in the air flow stirring mode, the controller 390 advances the process to step S15. When it is determined in step S14 that a predetermined period of time has not elapsed since the loader module 30 was operated in the airflow stirring mode, the controller 390 returns the process to step S13. That is, the controller 390 operates the loader module 30 in the airflow stirring mode until the predetermined period of time elapses.

Next, in step S15, the controller 390 operates the loader module 30 in the gas replacement mode. In the present embodiment, the controller 390 closes the circulation valve 332 and stops the circulation fan 314 in a state in which the introduction of the inert gas into the second chamber 320 from the inert gas source 341 and evacuation of the inside of the second chamber 320 are continued. As a result, the air in the second chamber 320 is pushed out by the large flow rate of the inert gas introduced into the second chamber 320 from the inert gas source 341, so that the air is exhausted from the inside of the second chamber at a high speed. As a result, the air atmosphere inside the second chamber 320 is replaced with the inert gas atmosphere in a short period of time.

Next, in step S16, the controller 390 determines whether or not the humidity in the second chamber 320 is equal to or lower than a second value. In the present embodiment, the controller 390 calculates the humidity in the second chamber 320 based on the measured value of the thermometer 324 and the measured value of the dew point meter 325, and determines whether or not the calculated humidity is equal to or lower than the second value. The second value is predetermined depending on, for example, the volume of the second chamber 320 or the like, and is smaller than the first value. The second value may be, for example, 10 ppm to 200 ppm. When it is determined in step S16 that the humidity in the second chamber 320 is equal to or lower than the second value, the controller 390 advances the process to step S17. When it is determined in step S16 that the humidity in the second chamber 320 is higher than the second value, the controller 390 returns the process to step S15. That is, the controller 390 operates the loader module 30 in the gas replacement mode until the humidity in the second chamber 320 becomes equal to or lower than the second value.

Next, in step S17, the controller 390 operates the loader module 30 in a circulation transition mode. In the present embodiment, the controller 390 controls the exhaust flow rate adjuster 352 to reduce the exhaust flow rate and to reduce the flow rate of the flow rate controller 344 for setting. Further, the controller 390 drives the circulation fan 314 and opens the circulation valve 332. As a result, the introduced amount of the inert gas is reduced, and the inert gas circulates between the inside of the first chamber 310 and the inside of the second chamber 320. In step S17, as shown in FIG. 6, the controller 390 preferably increases a rotation speed of the circulation fan 314 in a stepwise manner from a low speed to a high speed. As a result, it is possible to suppress an increase in humidity at the time of transition from the gas replacement mode to the circulation mode. Further, as illustrated in FIG. 7, the controller 390 may continuously increase the rotation speed of the circulation fan 314 from a low speed to a high speed.

Next, in step S18, the controller 390 operates the loader module 30 in the circulation mode and then terminates the process. In the present embodiment, in the state in which the circulation valve 332 is opened and a small amount of the inert gas is introduced into the second chamber 320 from the inert gas source 341 so that the inside of the second chamber 320 is evacuated at a small exhaust flow rate, the controller 390 drives the circulation fan 314 at a predetermined speed (a low speed). Then, the controller 390 terminates the process in this state. In the state in which the loader module 30 is operating in the circulation mode, transport of a wafer W is performed within the second chamber 320 by the transporter 31.

In step S18, in some embodiments, the controller 390 may adjust at least one of the gas introduction part 340 and the exhaust part 350 such that the inside of the first chamber 310 is in a positive pressure state. In the present embodiment, the controller 390 controls the exhaust flow rate adjuster 352 to reduce the exhaust flow rate for evacuating the inside of the second chamber 320, opens the valve 343, and adjusts the flow rate controller 344 to increase the amount of the inert gas supplied to the inside of the first chamber 310 through the circulation line 331. As a result, the inside of the first chamber 310 is set to a positive pressure state. However, the controller 390 may set the inside of the first chamber 310 to a positive pressure state, for example, only by controlling the exhaust flow rate adjuster 352 to reduce the exhaust flow rate of evacuating the inside of the second chamber 320. In addition, the controller 390 may set the inside of the first chamber 310 to a positive pressure state, for example, only by opening the valve 343 and adjusting the flow rate controller 344 to increase the amount of the inert gas supplied to the inside of the first chamber 310 through the circulation line 331. In addition, the controller 390 may set the inside of the first chamber 310 to a positive pressure state, for example, only by opening the valve 348 and increasing the degree of opening of the flow rate adjusting valve 347 to increase the amount of the clean dry air supplied into the first chamber 310 through the circulation line 331. Further, the controller 390 may set the inside of the first chamber to a positive pressure state by performing, for example, at least two or more of control of the exhaust flow rate adjuster 352, opening or closing of the valve 343, adjustment of the flow rate controller 344, adjustment of the flow rate adjusting valve 347, and opening or closing of the valve 348 in combination.

In this way, in step S18, the controller 390 adjusts at least one of the gas introduction part 340 and the exhaust part 350 such that the inside of the first chamber 310 is in a positive pressure state. As a result, it is possible to prevent air from being mixed into the inside of the first chamber 310 from the exterior of the loader module 30. Therefore, even when the circulation fan 314 is driven in a state in which the replacement gas is circulated between the inside of the first chamber 310 and the inside of the second chamber 320 to send the replacement gas from the inside of the first chamber 310 into the inside of the second chamber 320, it is possible to suppress the mixing of air into the inside of the second chamber 320. As a result, it is possible to maintain a low humidity environment with low replacement gas consumption.

As described above, according to the controlling method of the embodiment, the controller 390 executes a step of evacuating the inside of the second chamber 320 at a high speed while introducing a large flow rate of an inert gas into the inside of second chamber 320 without circulating the replacement gas between the inside of the first chamber 310 and the inside of the second chamber 320. As a result, the humidity in the second chamber 320 can be reduced in a short period of time. In other words, the time required to start the loader module 30 can be reduced.

According to the controlling method of the embodiment, the controller 390 controls the circulation fan 314 to be driven and the circulation valve 332 to be opened for a predetermined period of time between steps S11 and S15, that is, while the loader module 30 is operating in the gas replacement mode. As a result, the airflow in the second chamber 320 is stirred, and the air (humidity), which remains in the corner inside the second chamber 320 and is difficult to be replaced in the gas replacement mode, is exhausted to the exterior of the second chamber 320. As a result, the transition time from an air atmosphere to a low humidity environment can be reduced.

Further, according to the controlling method of the embodiment, when the operation of the loader module 30 transitions from the gas replacement mode to the circulation mode, the controller 390 operates the loader module 30 in the circulation transition mode. That is, when the operation of the loader module 30 transitions from the gas replacement mode to the circulation mode, the controller 390 increases the rotation speed of the circulation fan 314 from a low speed to a high speed. As a result, it is possible to suppress an increase in humidity when transitioning from the gas replacement mode to the circulation mode.

In the controlling method of the embodiment, a case of introducing, in step S18, a small flow rate of the inert gas from the inert gas source 341 into the second chamber 320 to evacuate the inside of the second chamber 320 with the small exhaust flow rate has been described, but the present disclosure is not limited thereto. For example, the controller 390 may close the valve 343 and control the exhaust flow rate adjuster 352 to stop the exhaust. However, in step S18, it is preferable to introduce a small flow rate of the inert gas from the inert gas source 341 into the second chamber 320 and to evacuate the inside of the second chamber 320 with a small exhaust flow rate. This makes it possible to maintain a low humidity environment even if water is mixed from the inside of the transport container 51 when the opening or closing door 37 that opens or closes the carry-in port 36 provided in the side surface of the loader module 30 is opened and a wafer W is transported to and from the transport container 51 placed on the load port 50.

In the controlling method of the embodiment, a case of determining whether or not the humidity in the second chamber 320 is equal to or lower than the first value and equal to or lower than the second value in each of step S12 and step S16 has been described, but the object of the determination is not limited to humidity. For example, the object of determination may be oxygen concentration, or both humidity and oxygen concentration.

Figure 8:
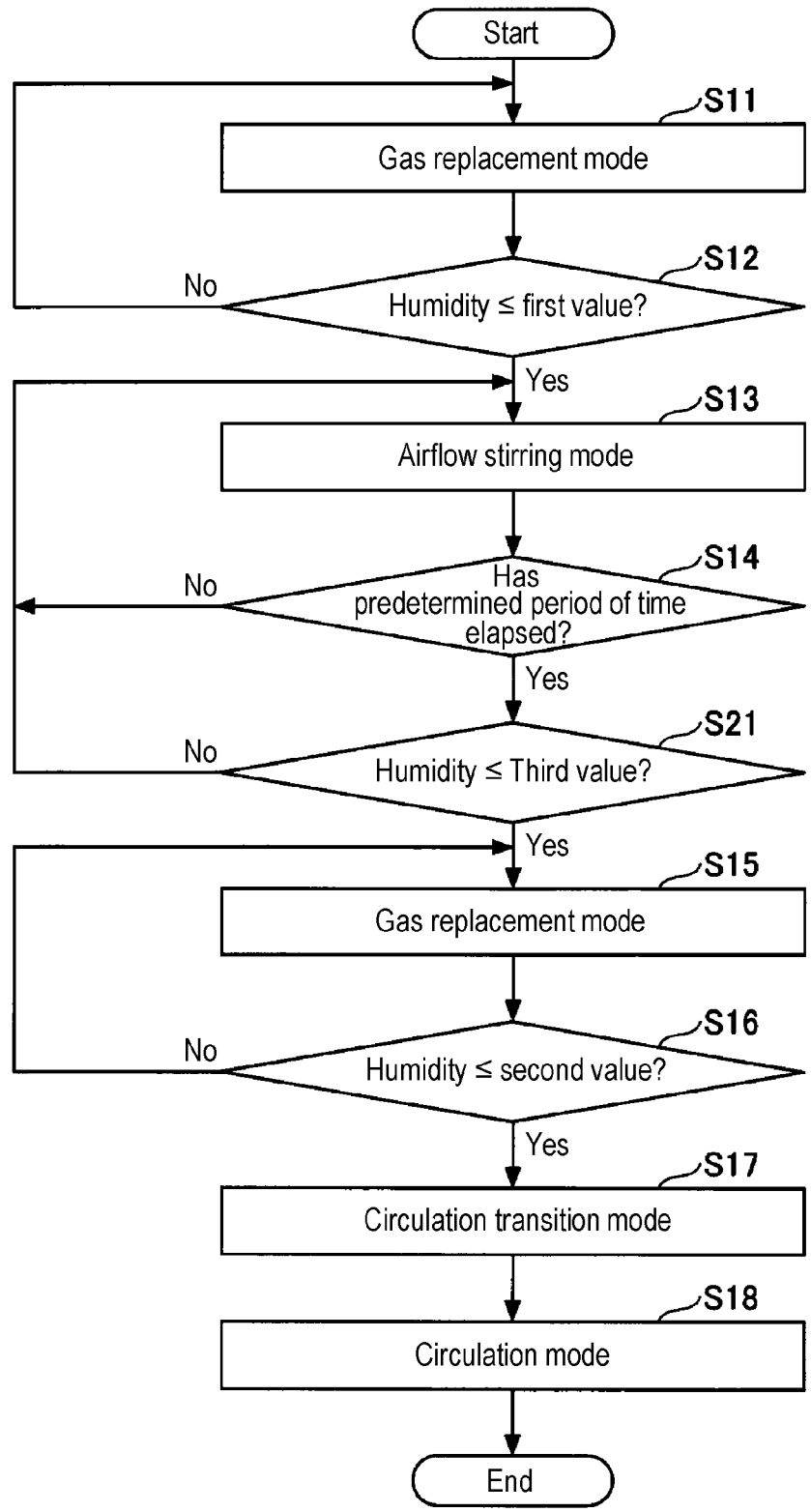
FIG. 8 is a diagram illustrating another example of the controlling method of the embodiment.

Another example of the controlling method of the embodiment will be described with reference to FIG. 8. FIG. 8 is a diagram illustrating another example of the controlling method of the embodiment.

The controlling method illustrated in FIG. 8 is different from the controlling method illustrated in FIG. 7 in that, when the humidity in the second chamber 320 is higher than a third value after a predetermined period of time has elapsed since the loader module 30 was operated in the airflow stirring mode, the loader module 30 is operated in the airflow stirring mode. The other points may be the same as the controlling method illustrated in FIG. 7.

Step S21 is performed when it is determined in step S14 that a predetermined period of time has elapsed since the loader module 30 was operated in the air flow stirring mode. In step S21, the controller 390 determines whether or not the humidity in the second chamber 320 is equal to or lower than the third value. In the present embodiment, the controller 390 calculates the humidity in the second chamber 320 based on the measured value of the thermometer 324 and the measured value of the dew point meter 325, and determines whether or not the calculated humidity is equal to or lower than the third value. The third value is, for example, a value predetermined depending on the volume of the second chamber 320 or the like, and may be the same as, for example, the first value. When it is determined in the step S21 that the humidity in the second chamber 320 is equal to or lower than the third value, the controller 390 advances the process to step S15. When it is determined in step S21 that the humidity in the second chamber 320 is higher than the third value, the controller 390 returns the process to step S13. That is, the controller 390 operates the loader module 30 in the airflow stirring mode until the humidity in the second chamber 320 becomes equal to or lower than the third value.

As described above, according to the controlling method of the embodiment illustrated in FIG. 8, the same operational effect as the controlling method of the embodiment illustrated in FIG. 7 can be obtained. According to the controlling method of the embodiment illustrated in FIG. 8, by setting the predetermined period of time in step S14 to be short, the time for operating the loader module 30 in the airflow stirring mode can be minimized, and thus the time required to start up the loader module 30 can be reduced.

In the controlling method of the embodiment illustrated in FIG. 8, a case of determining, in steps S12, S16 and S21, whether or not the humidity in the second chamber 320 is equal to or lower than the first value, equal to or lower than the second value, and equal to or lower than the third value, respectively, has been described, but the object of determination is not limited to humidity. For example, the object of determination may be oxygen concentration, or both humidity and oxygen concentration.

According to the present disclosure, the transition time from an air atmosphere to a low humidity environment can be reduced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling a substrate transport module that includes a first chamber provided with a fan, a second chamber to which a replacement gas is sent from the first chamber by the fan and which includes a transporter configured to transport a substrate, a circulation line configured to communicate the first chamber and the second chamber with each other and circulate the replacement gas, and a valve provided in the circulation line, wherein the method comprises:
    replacing an inside of the first chamber and an inside of the second chamber with the replacement gas by turning off the fan and closing the valve; and
    circulating the replacement gas through the circulation line by turning on the fan and opening the valve,
    wherein the circulating is performed after the replacing,
    wherein the replacing includes operating the substrate transport module in a gas replacement mode and operating the substrate transport module in an airflow stirring mode,
    wherein the operating the substrate transport module in the gas replacement mode includes controlling the fan to be turned off and the valve to be closed,
    wherein the operating the substrate transport module in the airflow stirring mode includes controlling the fan to be turned on and the valve to be opened, and wherein the operating the substrate transport module in the airflow stirring mode is performed while the operating the substrate transport module in the gas replacement mode is being performed.

2. The method of claim 1, wherein the circulating the replacement gas includes increasing a rotation speed of the fan in a stepwise or continuous manner.

3. The method of claim 2, wherein the circulating the replacement gas includes constantly maintaining the rotation speed of the fan.

4. The method of claim 3, wherein the circulating the replacement gas includes controlling the inside of the first chamber to be at a positive pressure state.

5. The method of claim 4, wherein the circulating the replacement gas includes transporting the substrate by the transporter.

6. The method of claim 5, wherein the replacing includes, after the substrate transport module operates in the airflow stirring mode, operating the substrate transport module in the airflow stirring mode until the humidity in the second chamber is equal to or lower than a predetermined value.

7. The method of claim 6, wherein, the replacing and the circulating the replacement gas include controlling to introduce the replacement gas into the first chamber and/or the second chamber, and wherein a flow rate of the replacement gas introduced into the first chamber and/or the second chamber in the circulating the replacement gas is controlled to be smaller than a flow rate of the replacement gas introduced into the first chamber and/or the second chamber in the replacing.

8. The method of claim 7, wherein the replacement gas is an inert gas or a clean dry air.

9. The method of claim 8, wherein the method is performed when starting the substrate transport module or when returning the substrate transport module after maintenance of the substrate transport module.

10. The method of claim 1, wherein the circulating the replacement gas includes constantly maintaining a rotation speed of the fan.

11. The method of claim 1, wherein the circulating the replacement gas includes controlling the inside of the first chamber to be at a positive pressure state.

12. The method of claim 1, wherein the circulating the replacement gas includes transporting the substrate by the transporter.

13. The method of claim 1, wherein the replacing includes, after the substrate transport module operates in the airflow stirring mode, operating the substrate transport module in the airflow stirring mode until the humidity in the second chamber is equal to or lower than a predetermined value.

14. The method of claim 1, wherein, the replacing and the circulating the replacement gas include controlling to introduce the replacement gas into the first chamber and/or the second chamber, and wherein a flow rate of the replacement gas introduced into the first chamber and/or the second chamber in the circulating the replacement gas is controlled to be smaller than a flow rate of the replacement gas introduced into the first chamber and/or the second chamber in the replacing.

15. The method of claim 1, wherein the replacement gas is an inert gas or a clean dry air.

16. The method of claim 1, wherein the method is performed when starting the substrate transport module or when returning the substrate transport module after maintenance of the substrate transport module.

17. A substrate transport module that transports a substrate to a processing chamber, the substrate transport module comprising:
a first chamber provided with a fan;
a second chamber to which a replacement gas is sent from the first chamber by the fan and which includes a transporter configured to transport the substrate;
a circulation line configured to communicate the first chamber and the second chamber with each other and circulate the replacement gas;
a valve provided in the circulation line; and
a controller,
wherein the controller is configured to perform:
replacing an inside of the first chamber and an inside of the second chamber with the replacement gas by turning off the fan and closing the valve; and
circulating the replacement gas through the circulation line by turning on the fan and opening the valve,
wherein the circulating is performed after the replacing,
wherein the replacing includes operating the substrate transport module in a gas replacement mode and operating the substrate transport module in an airflow stirring mode,
wherein the operating the substrate transport module in the gas replacement mode includes controlling the fan to be turned off and the valve to be closed,
wherein the operating the substrate transport module in the airflow stirring mode includes controlling the fan to be turned on and the valve to be opened, and
wherein the operating the substrate transport module in the airflow stirring mode is performed while the operating the substrate transport module in the gas replacement mode is being performed.

* * * * *